(12) United States Patent
Le

(10) Patent No.: US 12,334,150 B2
(45) Date of Patent: Jun. 17, 2025

(54) SYNAPTIC ARRAY FOR FIELD-TRAINING-CAPABLE IN-MEMORY COMPUTING USING NON-VOLATILE MEMORY TECHNOLOGIES

(71) Applicant: San Jose State University Research Foundation, San Jose, CA (US)

(72) Inventor: Binh Quang Le, San Jose, CA (US)

(73) Assignee: San Jose State University Research Foundation, San Jose, CA (US)

( * ) Notice: Subject to any disclaimer, the term of this patent is extended or adjusted under 35 U.S.C. 154(b) by 56 days.

(21) Appl. No.: 18/188,978

(22) Filed: Mar. 23, 2023

(65) Prior Publication Data

US 2023/0317163 A1    Oct. 5, 2023

Related U.S. Application Data

(60) Provisional application No. 63/325,053, filed on Mar. 29, 2022.

(51) Int. Cl.
*G11C 13/00* (2006.01)
*G11C 11/54* (2006.01)

(52) U.S. Cl.
CPC .......... *G11C 13/0069* (2013.01); *G11C 11/54* (2013.01); *G11C 13/0007* (2013.01);
(Continued)

(58) Field of Classification Search
CPC . G11C 13/0069; G11C 11/54; G11C 13/0007; G11C 13/0026; G11C 13/0028;
(Continued)

(56) References Cited

U.S. PATENT DOCUMENTS 9,092,736 B2    7/2015  Aparin et al.
11,114,158 B1 *  9/2021  Ge ........................... G11C 7/16
(Continued)

FOREIGN PATENT DOCUMENTS

EP          3459019       3/2019
KR         101432197      8/2014
(Continued)

OTHER PUBLICATIONS

"International Application Serial No. PCT US2023 064856, International Search Report mailed Jun. 20, 2023", 4 pages.
(Continued)

*Primary Examiner* — Jay W. Radke
(74) *Attorney, Agent, or Firm* — Schwegman Lundberg & Woessner, P.A.

(57) ABSTRACT

An apparatus and system are described to provide an in-memory computing non-volatile flash memory cell array used in a neural network. Each cell includes a Resistive RAM memory (RRAM) and a physical resistor formed from a high resistive material. The RRAM is programmed to either an on or off state in which the resistance is respectively significantly less or more than the resistor to permit the RRAM to act as a switch and allow for in-situ training. Multi-bit RRAM cells contain multiple RRAMs, each of which is connected to a resistor having a different resistance and read using the same input line. The resistors are formed from the same material as the resistor in the analog-to-digital converter used to read the array.

18 Claims, 14 Drawing Sheets

(52) U.S. Cl.
CPC ...... *G11C 13/0026* (2013.01); *G11C 13/0028* (2013.01); *G11C 13/004* (2013.01); *G11C 2013/0045* (2013.01); *G11C 2213/72* (2013.01); *G11C 2213/74* (2013.01); *G11C 2213/79* (2013.01); *G11C 2213/82* (2013.01)

(58) Field of Classification Search
CPC .......... G11C 13/004; G11C 2013/0045; G11C 2213/72; G11C 2213/74; G11C 2213/79; G11C 2213/82; G11C 13/0033; G11C 13/0035; G11C 13/003; G06N 3/045; G06N 3/065
See application file for complete search history.

(56) References Cited

U.S. PATENT DOCUMENTS

| | | | |
|---|---|---|---|
| 11,200,948 B1 * | 12/2021 | Ambrosi | G11C 13/0007 |
| 11,861,489 B2 | 1/2024 | Miao et al. | |
| 2017/0040054 A1 * | 2/2017 | Friedman | G11C 7/16 |
| 2018/0322094 A1 * | 11/2018 | Friedman | G06F 17/11 |
| 2020/0034686 A1 | 1/2020 | Chiu et al. | |
| 2022/0261624 A1 | 8/2022 | Song | |
| 2023/0029509 A1 * | 2/2023 | Lee | G06N 3/065 |

FOREIGN PATENT DOCUMENTS

| | | |
|---|---|---|
| WO | 2019147522 | 8/2019 |
| WO | 2020052342 | 3/2020 |
| WO | 2023192795 | 10/2023 |

OTHER PUBLICATIONS

"International Application Serial No. PCT US2023 064856, Written Opinion mailed Jun. 20, 2023", 5 pages.

Jeong, Hongsik, "Memristor devices for neural networks", Journal of Physics D: Applied Physics, Institute of Physics Publishing, Bristol, GB, vol. 52, No. 2, (Oct. 30, 2018), 28 pages.

Bankman, D., "RRAM-Based In-Memory Computing for Embedded Deep Neural Networks", 2019 53rd Asilomar Conference on Signals, Systems, and Computers. IEEE, 2019., (Nov. 6, 2019), 5 pages.

Can, Li, "In-Memory Computing with Memristor Arrays", 2018 IEEE International Memory Workshop (IMW). IEEE, 2018., (May 13, 2018), 4 pages.

Fick, L., "Analog In-Memory Subthreshold Deep Neural Network Accelerator", 2017 IEEE Custom Integrated Circuits Conference (CICC). IEEE, 2017., (Apr. 30, 2017), 4 pages.

Hubara, Itay, "Quantized Neural Networks: Training Neural Networks with Low Precision Weights and Activations", Journal of Machine Learning Research 18.187 (2018): 1-30., (Apr. 2018), 30 pages.

Pozidis, H., "Enabling Technologies for Multilevel Phase-Change Memory", European Phase Change and Ovonics Symposium, 2011, (2011), 8 pages.

"International Application Serial No. PCT/US2023/064856, International Preliminary Report on Patentability mailed Oct. 10, 2024", 7 pgs.

* cited by examiner

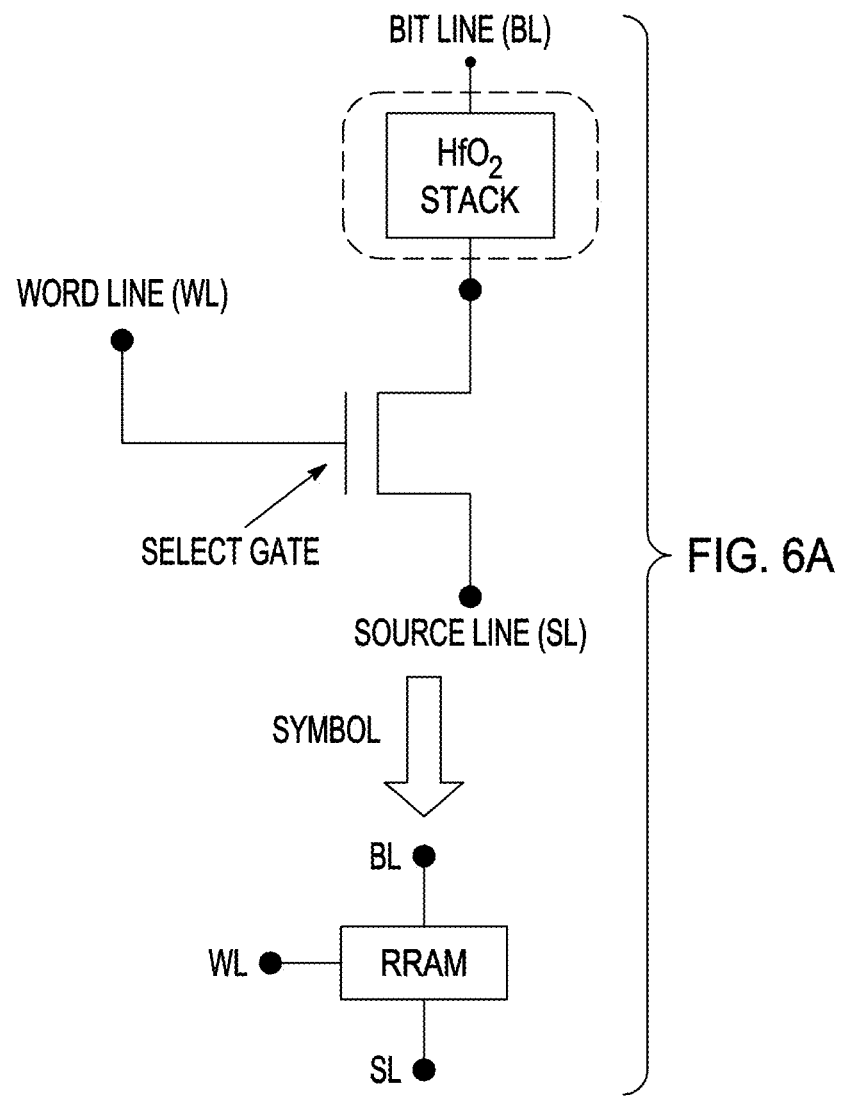

SYNAPTIC ARRAY FOR FIELD-TRAINING-CAPABLE IN-MEMORY COMPUTING USING NON-VOLATILE MEMORY TECHNOLOGIES

PRIORITY CLAIM

This application claims the benefit of priority to: U.S. Provisional Patent Application No. 63/325,053, filed Mar. 29, 2022, which is incorporated herein by reference in its entirety.

TECHNICAL FIELD

Embodiments pertain to non-volatile memory arrays. In particular, some embodiments relate to neural networks using non-volatile memory arrays.

BACKGROUND

Deep Neural Networks (DNN) for Artificial Intelligent (AI) applications involve a tremendous amount of computation, and in the near future, the performance requirements can be orders of magnitude greater than the current requirements. This may lead to unacceptable levels of power/energy consumption.

While on-chip non-volatile Resistive RAM memory (RRAM) may be used for DNN, the energy efficiency is still limited by the high-energy memory access for DNN weights (synapses). In-Memory Computing (IMC) may be used to provide DNN computations. IMC reduces the energy cost of weight memory access by performing calculations inside the memory itself using an analog current summing approach. The memory usually consists of non-volatile flash memory cells that act as synapses. The resistances of the non-volatile flash memory cells are tuned during a training mode of the DNN. In particular, the non-volatile flash memory cells are tuned in an analog manner to achieve the desired resistance values using an iterative programming algorithm. The process of tuning the resistances of the non-volatile flash memory cells is generally slow (low performance) and non-linear with respect to the applied voltages. Moreover, the cell resistance values constantly change, an issue known in the non-volatile memory field as "retention". In addition, non-volatile flash memory cells that experience many training cycles become worn out, known as the "endurance" issue, making the retention even worse. The non-linearity, retention, and endurance issues not only affect the accuracy of the synaptic resistances, but also degrade the performance because the resistance tuning algorithm causes the addition of margins to counteract these undesirable issues.

The performance provides a reason why IMC DNN edge devices (devices close to the data sources, or at the edge of a communication network, such as smart security cameras or smart sensors) are used only for inference, not for training. In the inference mode, the trained DNN, whose DNN weights are pre-loaded, may be used for any of a number of different applications, for example to detect objects. The DNN weights are not modified during the inference mode.

It would be desirable to provide the capability to train DNN edge devices even after the DNN edge devices have been deployed in the field (also referred to as field-training or online training capability) to avoid sending large amounts of data through crowded networks for processing. This reduces power consumption and improves responding latency and data security.

BRIEF DESCRIPTION OF THE FIGURES

In the figures, which are not necessarily drawn to scale, like numerals may describe similar components in different views. Like numerals having different letter suffixes may represent different instances of similar components. The figures illustrate generally, by way of example, but not by way of limitation, various embodiments discussed in the present document.

FIG. 6A illustrates a traditional RRAM in accordance with some embodiments.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

As above, field training capability is desired for DNN edge devices. To be effective, such capability should also achieve one or more orders of magnitude of improvement in both the performance and energy efficiency of the edge device compared to current devices. The high-performance, energy-efficient and field-training-capable DNN (or other machine learning (ML)) devices described herein may be used in many areas, ranging from commercial organizations and research institutes to the military.

Figure 1:
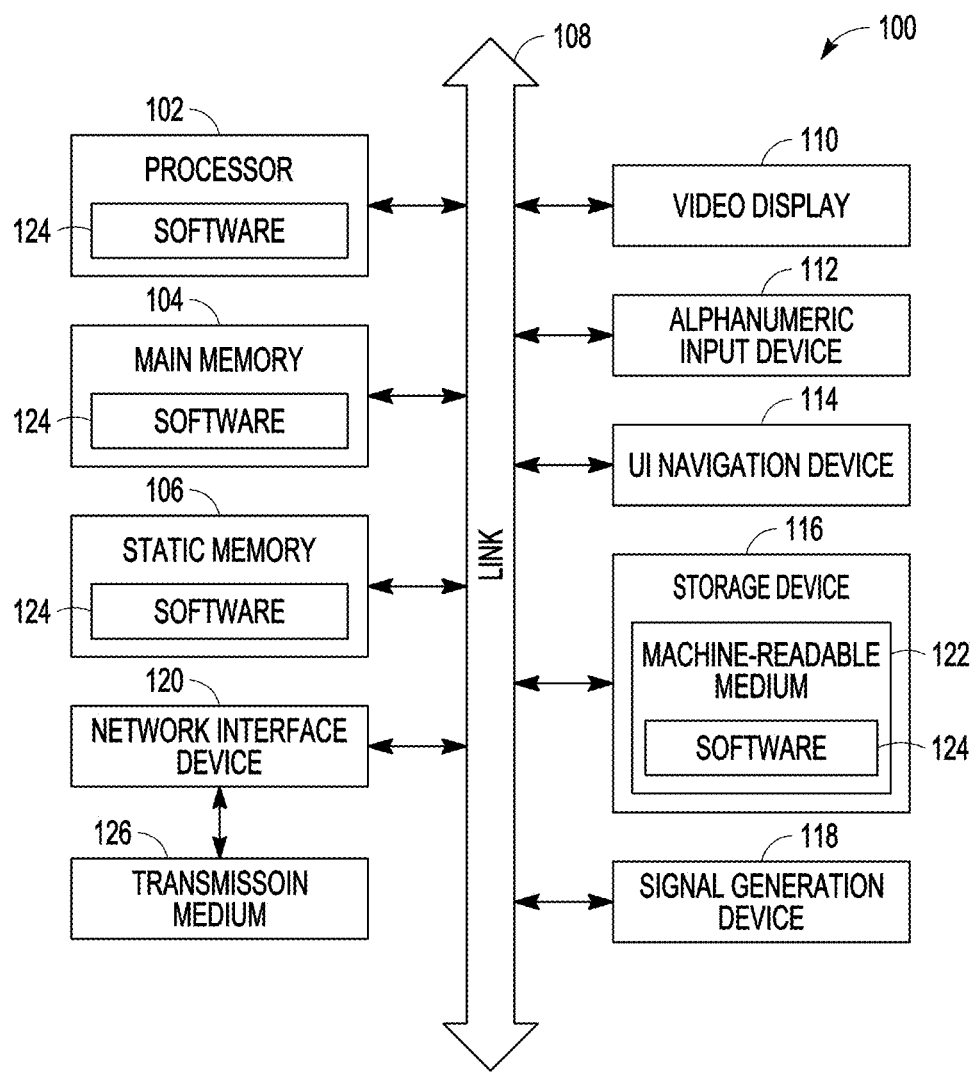
FIG. 1 illustrates a block diagram of an edge device in accordance with some embodiments.

FIG. 1 illustrates a block diagram of an edge device in accordance with some embodiments. The edge device 100 may be a user equipment (UE) such as a specialized computer, a personal or laptop computer (PC), a tablet PC, or a smart phone, smart device (e.g., smart camera), dedicated network equipment such as an evolved NodeB (eNB) or $5^{th}$ generation NodeB (gNB), a server running software to configure the server to operate as a network device, a virtual device, or any machine capable of executing instructions (sequential or otherwise) that specify actions to be taken by that machine. Note that communications described herein may be encoded before transmission by the transmitting entity (e.g., UE, gNB) for reception by the receiving entity (e.g., gNB, UE) and decoded after reception by the receiving entity.

Examples, as described herein, may include, or may operate on, logic or a number of components, modules, or mechanisms. Modules and components are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" (and "component") is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

The edge device 100 may include a hardware processor (or equivalently processing circuitry) 102 (e.g., a central processing unit (CPU), a GPU, a hardware processor core, or any combination thereof), a main memory 104 and a static memory 106, some or all of which may communicate with each other via an interlink (e.g., bus) 108. The main memory 104 may contain any or all of removable storage and non-removable storage, volatile memory or non-volatile memory. The edge device 100 may further include a display unit 110 such as a video display, an alphanumeric input device 112 (e.g., a keyboard), and a user interface (UI) navigation device 114 (e.g., a mouse). In an example, the display unit 110, input device 112 and UI navigation device 114 may be a touch screen display. The edge device 100 may additionally include a storage device (e.g., drive unit) 116, a signal generation device 118 (e.g., a speaker), a network interface device 120, and one or more sensors, such as a global positioning system (GPS) sensor, compass, accelerometer, or other sensor. The edge device 100 may further include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 116 may include a non-transitory machine readable medium 122 (hereinafter simply referred to as machine readable medium) on which is stored one or more sets of data structures or instructions 124 (e.g., software) embodying or utilized by any one or more of the techniques or functions described herein. The instructions 124 may also reside, completely or at least partially, within the main memory 104, within static memory 106, and/or within the hardware processor 102 during execution thereof by the edge device 100. While the machine readable medium 122 is illustrated as a single medium, the term "machine readable medium" may include a single medium or multiple media (e.g., a centralized or distributed database, and/or associated caches and servers) configured to store the one or more instructions 124.

The term "machine readable medium" may include any medium that is capable of storing, encoding, or carrying instructions for execution by the edge device 100 and that cause the edge device 100 to perform any one or more of the techniques of the present disclosure, or that is capable of storing, encoding or carrying data structures used by or associated with such instructions. Non-limiting machine readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks.

The instructions 124 may further be transmitted or received over a communications network using a transmission medium 126 via the network interface device 120 utilizing any one of a number of wireless local area network (WLAN) transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks. Communications over the networks may include one or more different protocols, such as Institute of Electrical and Electronics Engineers (IEEE) 802.11 family of standards known as Wi-Fi, IEEE 802.16 family of standards known as WiMax, IEEE 802.15.4 family of standards, a Long Term Evolution (LTE) family of standards, a Universal Mobile Telecommunications System (UMTS) family of standards, peer-to-peer (P2P) networks, a next generation (NG)/$5^{th}$ generation (5G) standards among others. In an example, the network interface device 120 may include one or more physical jacks (e.g., Ethernet, coaxial, or phone jacks) or one or more antennas to connect to the transmission medium 126.

Note that the term "circuitry" as used herein refers to, is part of, or includes hardware components such as an electronic circuit, a logic circuit, a processor (shared, dedicated, or group) and/or memory (shared, dedicated, or group), an Application Specific Integrated Circuit (ASIC), a field-programmable device (FPD) (e.g., a field-programmable gate array (FPGA), a programmable logic device (PLD), a complex PLD (CPLD), a high-capacity PLD (HCPLD), a structured ASIC, or a programmable SoC), digital signal processors (DSPs), etc., that are configured to provide the described functionality. In some embodiments, the circuitry may execute one or more software or firmware programs to provide at least some of the described functionality. The term "circuitry" may also refer to a combination of one or more hardware elements (or a combination of circuits used in an electrical or electronic system) with the program code used to carry out the functionality of that program code. In these embodiments, the combination of hardware elements and program code may be referred to as a particular type of circuitry.

The term "processor circuitry" or "processor" as used herein thus refers to, is part of, or includes circuitry capable of sequentially and automatically carrying out a sequence of arithmetic or logical operations, or recording, storing, and/or transferring digital data. The term "processor circuitry" or "processor" may refer to one or more application processors, one or more baseband processors, a physical central processing unit (CPU), a single- or multi-core processor, and/or any other device capable of executing or otherwise operating computer-executable instructions, such as program code, software modules, and/or functional processes.

Figure 2:
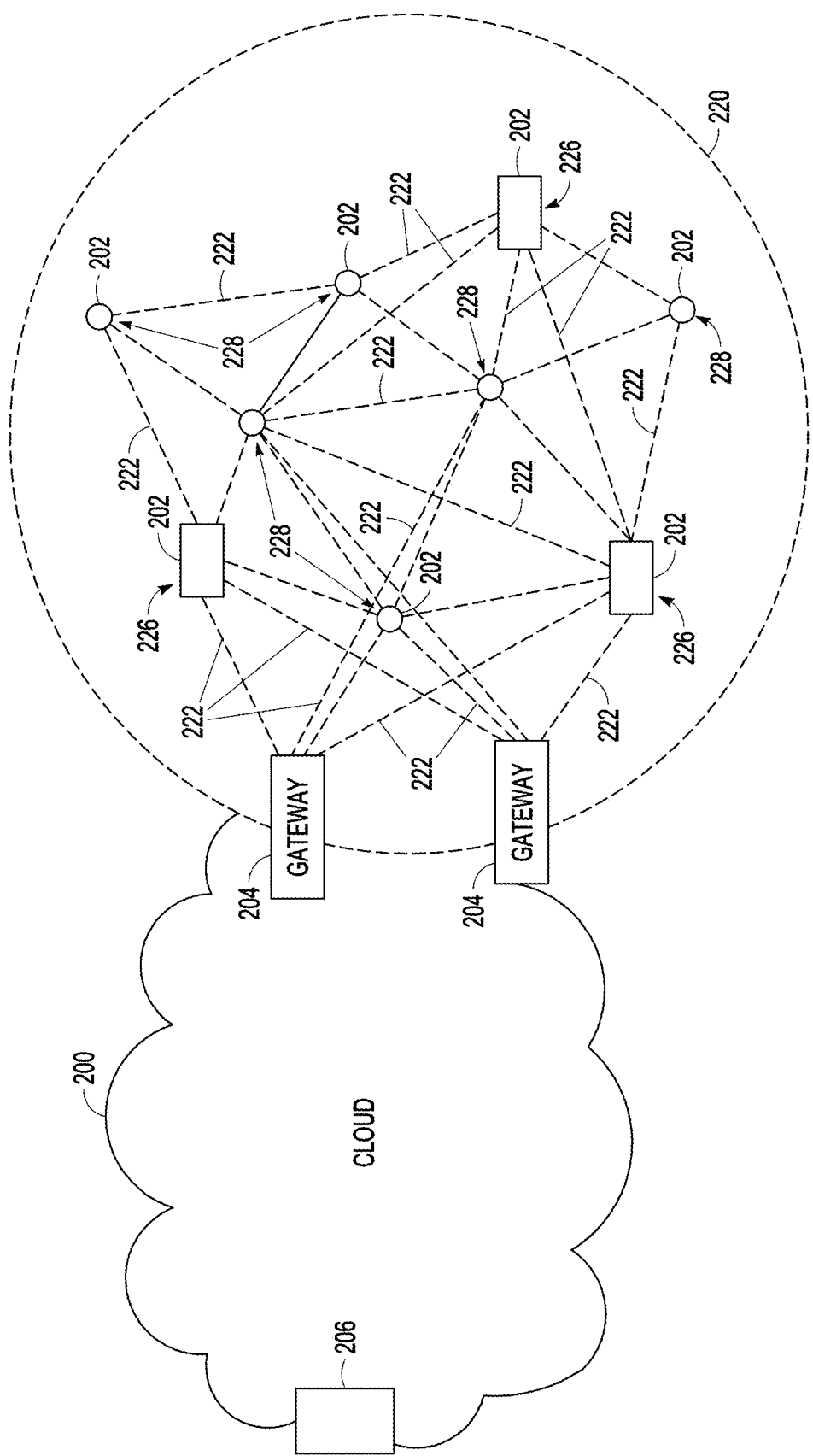
FIG. 2 illustrates an edge network in accordance with some embodiments.

FIG. 2 illustrates an edge network in accordance with some embodiments. In particular, FIG. 2 illustrates a cloud computing network in communication with a mesh network of IoT devices operating as a fog platform in a networked scenario. The mesh network of IoT devices may be termed a fog network 220, established from a network of devices operating at the edge of the cloud 200.

The fog network 220 may be considered to be a massively interconnected network in which IoT devices 202 are in communications with each other, for example, by radio links 222. The fog network 220 may establish a horizontal, physical, or virtual resource platform that can be considered to reside between IoT edge devices and cloud or data centers. A fog network may both support vertically-isolated, latency-sensitive applications through distributed computing, storage, and network connectivity operations and may also be used to distribute resources and services at and among the edge and the cloud. Thus, references in the present document to the "edge", "fog", and "cloud" are not necessarily discrete or exclusive of one another.

As an example, the fog network 220 may be facilitated using an interconnect specification released by the Open Connectivity Foundation™ (OCF). This standard enables devices to discover each other and establish communications for interconnects. Other interconnection protocols may also be used, including, for example, the optimized link state routing (OLSR) Protocol, the better approach to mobile ad-hoc networking (B.A.T.M.A.N.) routing protocol, or the OMA Lightweight M2M (LWM2M) protocol, among others.

Three types of IoT devices 202 are shown in FIG. 2: gateways 204, data aggregators 226, and sensors 228, although any combinations of IoT devices 202 and functionality may be used. The gateways 204 may be edge devices that provide communications between the cloud 200 and the fog network 220, and may also provide the backend process function for data obtained from sensors 228, such as motion data, flow data, temperature data, and the like. The data aggregators 226 may collect data from any number of the sensors 228, and perform backend processing function for the analysis. The results and/or raw data may be transmitted to the cloud 200 through the gateways 204. The sensors 228 may be full IoT devices 202, for example, capable of both collecting data and processing the data. In some cases, the sensors 228 may be more limited in functionality, for example, collecting the data and enabling the data aggregators 226 or gateways 204 to process the data.

Communications from any IoT device 202 may be transmitted along a path between any of the IoT devices 202 to reach the gateways 204. In these networks, the number of interconnections provide substantial redundancy, enabling communications to be maintained, even with the loss of a number of IoT devices 202. Further, the use of a mesh network may enable IoT devices 202 that are very low power or located at a distance from infrastructure to be used, as the range to connect to another IoT device 202 may be much less than the range to connect to the gateways 204.

The fog network 220 provided from these IoT devices 202 may be presented to devices in the cloud 200, such as a server 206, as a single device located at the edge of the cloud 200. In this fashion, the fog network 220 may be considered a distributed platform that provides computing and storage resources to perform processing or data-intensive tasks such as data analytics, data aggregation, and machine-learning, among others.

Figure 3:
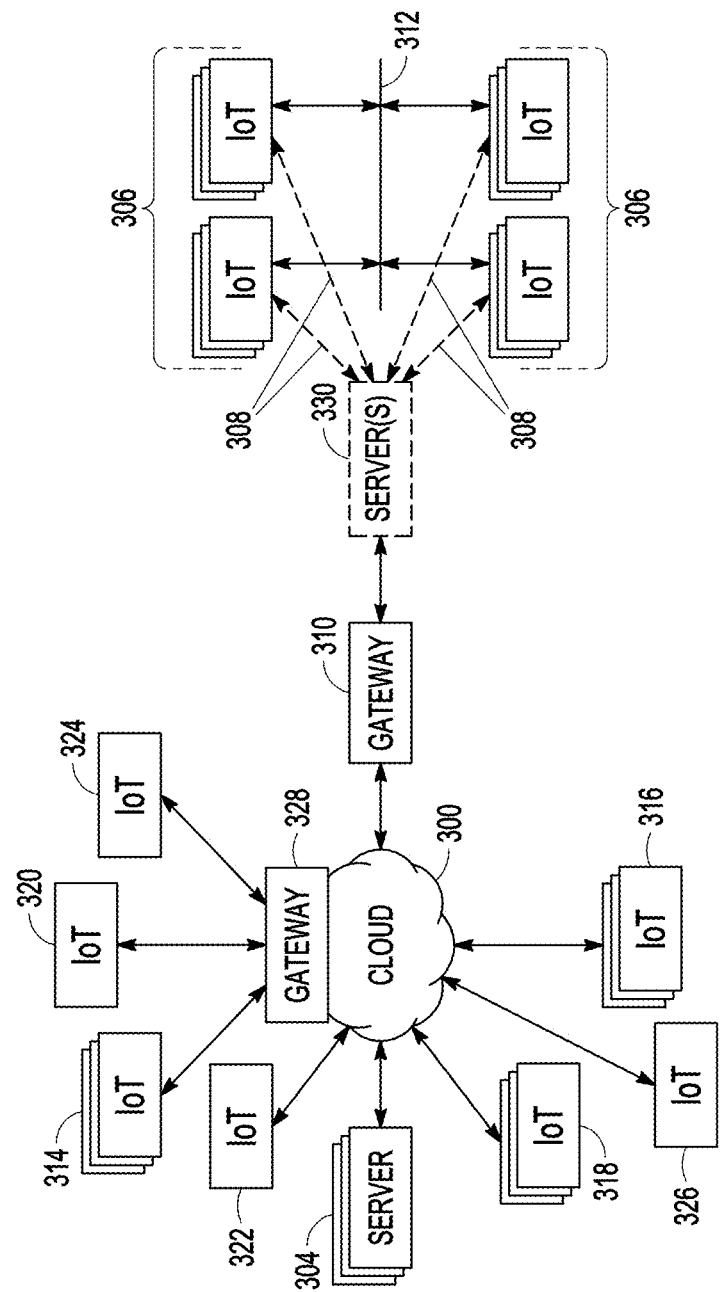
FIG. 3 illustrates an edge network in accordance with some embodiments.

FIG. 3 illustrates an edge network in accordance with some embodiments. FIG. 3 illustrates a drawing of a cloud computing network, or cloud 300, in communication with a number of IoT devices 306, 314, 316, 318, 320, 322, 324, 326. The cloud 300 may represent the Internet, a local area network (LAN), or a wide area network (WAN), such as a proprietary network for a company. The IoT devices may include any number of different types of devices, grouped in various combinations. The IoT devices may be in communication with the cloud 300 through wired links 312 or wireless links 308, such as LPWA links, optical links, and the like. Further, a wired or wireless sub-network may allow the IoT devices to communicate with each other, such as through a local area network, a wireless local area network, and the like. The IoT devices may use another device, such as a gateway 310 to communicate with remote locations such as the cloud 300; the IoT devices may also use one or more servers 304, 330 to facilitate communication with the cloud 300 or with the gateway 310. For example, the one or more servers 304, 330 may operate as an intermediate network node to support a local edge cloud or fog implementation among a local area network. Further, the gateway 328 that is depicted may operate in a cloud-to-gateway-to-many edge devices configuration, such as with the various IoT devices being constrained or dynamic to an assignment and use of resources in the cloud 300.

Example groups of IoT devices may include UEs, remote weather stations, local information terminals, alarm systems, automated teller machines, alarm panels, and moving vehicles, such as emergency vehicles or other vehicles, among many others. Each of these IoT devices may be in communication with other IoT devices, with servers 304, with another IoT fog platform or system, or a combination therein. The groups of IoT devices may be deployed in various residential, commercial, and industrial settings (including in both private or public environments). As may be seen from FIG. 3, a large number of IoT devices may be communicating through the cloud 300. This may allow different IoT devices to request or provide information to other devices autonomously. Clusters of IoT devices may be equipped to communicate with other IoT devices as well as with the cloud 300. This may allow the IoT devices to form an ad-hoc network between the devices, allowing them to function as a single device, which may be termed a fog platform or system (e.g., as described above with reference to FIG. 2).

Figure 4:
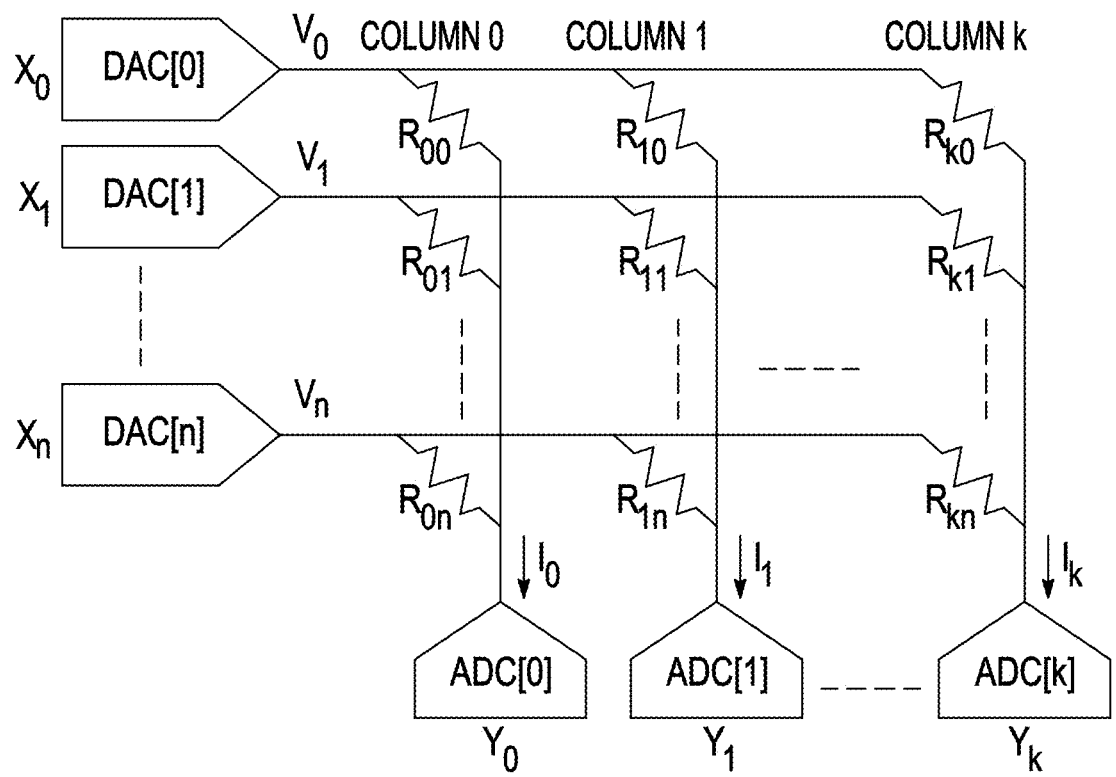
FIG. 4 illustrates an IMC array in accordance with some embodiments.

FIG. 4 illustrates an IMC array in accordance with some embodiments. The IMC array may be provided in any of the IoT devices or other devices shown in FIGS. 1-3. In FIG. 4, each column represents a neuron and each resistor represents a synapse. The conductance of the resistor is called the weight in the machine learning vocabulary and may be implemented by a non-volatile memory cell. The columns act as neurons since they execute multiplication and accumulation operations (MAC). For IMCs, the MAC operation is performed in an analog manner. In this case, the digital input values $X_0, X_1, \ldots, X_n$ are first converted to analog voltages $V_0, V_1, \ldots, V_n$ by the digital-to-analog converters (DACs). Column 0 is used, as an example, to illustrate the MAC operation. According to Ohm's law, the currents running through the resistors in column 0 are $V_0(1/R_{00})$, $V_1(1/R_{01}), \ldots, V_n(1/R_{0n})$. Note that, the conductance of a resistor R is G=1/R, therefore, these currents represent the multiplication between the inputs and the corresponding weights. The currents are accumulated by tying one end of the resistors together to produce the total current $I_0$, which is $V_0(1/R_{00})+V_1(1/R_{01})+ \ldots +V_n(1/R_{0n})$. This total current is then multiplied with a reference resistor $R_{ADC}$ in the analog-to-digital converter ADC[0] to produce the analog output voltage (Ohm's law):

$$VOUT_0 = V_0(R_{ADC}/R_{00}) + V_1(R_{ADC}/R_{01}) + \ldots + V_n(R_{ADC}/R_{0n}) \quad (1)$$

ADC[0] then converts $VOUT_0$ to the digital output $Y_0$.

Equation (1) shows that the IMC array can perform the MAC function of neural network neurons in an energy-efficient manner since the weight values are not read out of the memory array before being multiplied with the input values. Instead, the MAC operation takes place in the IMC array itself. This energy savings is significant since reading out a weight value in a regular memory is a high-energy-cost operation, and for a neural network, the number of weights is usually quite large. Thus, if there are 1000 inputs and 1000 outputs in the arrangement of FIG. 4, the number of weights is 1,000,000, far larger than the numbers of inputs and outputs. Note that similar MAC operations also happen in parallel in the other columns.

Figure 5A:
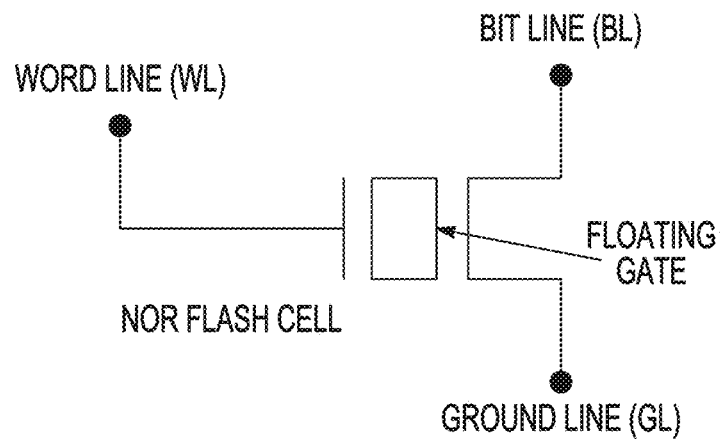
FIG. 5A illustrates a NOR flash memory cell in accordance with some embodiments.

As above, the IMC array has two main operations: training (in the training mode) and inference (in the inference mode). Inference is used when the input is applied and the output is calculated using Equation (1). IMC devices may use the inference operation to perform a particular function, such as object recognition in a smart security camera. During inference, the resistance values of the IMC array such as $R_{00}, R_{01}, \ldots, R_{0n}$, are fixed. These resistance values are pre-determined by using a DNN training algorithm and pre-programmed into the non-volatile flash memory cells during an off-line training process. The cell resistances may be adjusted by changing threshold voltages of NOR flash cells. FIG. 5A illustrates a NOR flash memory cell in accordance with some embodiments.

As shown in FIG. 5A, the cell has a wordline (WL) terminal, a bitline (BL) terminal, and a groundline (GL) terminal. In FIG. 5A, the threshold voltage of the cell is increased by applying high-voltage pulses (generated, e.g., by internal charge pumps, typically 10V) to the WL terminal and the BL terminal, and 0V to the GL terminal of the cell. This pulls electrons into the floating gate of the cell. To decrease the threshold voltage of the cell, 0V is applied to the WL terminal and 10V (typically) to the BL terminal with the GL terminal floating (open, not connected to any voltage sources) to pull electrons out of the floating gate. This training process is slow, requiring several programming pulses each of which takes tens of microseconds and is energy-intensive because a large number of high-voltage pulses are applied in an iterative process. Moreover, a verify operation is provided between each pair of high voltage pulses to ensure an accurate cell resistance is set for each cell.

IMC devices using traditional flash cells, however, may be limited to inference only, not (online) training, due to the low training performance and high energy/power consumption. This lack of online training capability for the IMC edge devices is problematic because DNN training at the edge is useful for IoT edge systems. Training at edge devices avoids transmission of large amounts of local data from the edge devices to the cloud, leading to significant reduction in energy/power consumption as well as shortening latency and improving data security because raw local data does not have to be sent through vulnerable networks.

Figure 5B:
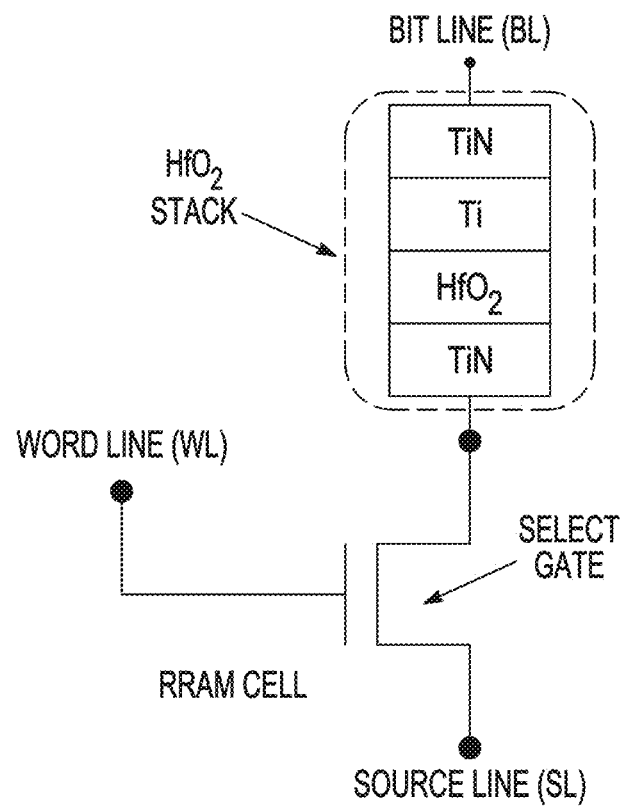
FIG. 5B illustrates a non-volatile flash memory cell in accordance with some embodiments.

To provide the training capability for IMC edge devices, emerging non-volatile memory (ENVM) technologies such as Resistive Random-Access Memory (RRAM), PCM (Phase Change Memory), Magnetic Random-Access memory (MRAM), or Spin-Transfer Torque Random Access memory (STT-RAM) may be used, among others. FIG. 5B illustrates a non-volatile flash memory cell in accordance with some embodiments, specifically an RRAM cell that contains a multilayer stack to provide a resistor. The multilayer stack may include layers of TiN, Ti, and $HfO_2$, as shown. In other embodiments, other layers may be used to provide the characteristics described below. ENVM cells can be programmed much faster than the traditional NOR flash cells, and high voltages may be avoided, leading to high performance and better energy efficiency. The RRAM cell shown in FIG. 5B can be used to implement the resistors in FIG. 4 because the resistance of the cell can be adjusted based on the voltage levels applied at the BL, WL and source line SL terminals.

Specifically, to reduce the resistance of an RRAM cell (the SET operation), a voltage pulse (typically 1.5V) is applied to the WL terminal to select the cell (and to limit the current), while another voltage pulse of 1.5V is concurrently applied at the BL terminal and 0V is applied at the SL terminal. The electric field created across the Ti/$HfO_2$ stack induces a conductive filament in the $HfO_2$ stack. The larger the electric field, the bigger and longer the filament and thus the smaller the resistance. To increase this resistance (the RESET operation), a reverse electric field is applied, with voltage pulses typically of 3.5V, 2.5V and 0V applied at the WL, SL and BL terminals, respectively. A PCM cell has a similar topology to that of the RRAM cell shown in FIG. 5B, except a phase-change stack, such as GeSbTe (GST) is used instead of an $HfO_2$ stack.

However, the programming process (RESET or SET operation) may suffer from significant cell-to-cell variation and the intrinsic variation of the memory material. The same voltages applied to one cell can induce a different cell resistance in another cell. Even for the same cell, applying the same voltages can produce a different cell resistance at different times. This limits speed of the programming process—training is unable to be performed with a single programming voltage pulse but instead uses many pulses in an iterative process (with verify pulses between programming pulses) to gradually bring the cell resistance to the desired level.

Examples of the non-linear nature and the cell-to-cell variations experienced when programming RRAM memory cells in the SET operation (which decreases the resistance) show that the resistance changes abruptly in different cells at different applied voltages, ranging from 0.5V to 1.0V. The programming variation within a cell varies also dependent on the resistance; the higher the target cell resistance, the greater the variation. For example, if the target cell resistance is 25KΩ, a programming pulse can bring the cell to any resistance level around the mean value of 25KΩ with a standard deviation of about 10KΩ, a large variation. If the target cell resistance is 3KΩ, the standard deviation is much better, at about 0.3KΩ. However, to meet the power consumption requirements for commercial products, the target cell resistance is higher (to reduce the cell current)—in particular, 10KΩ or more. The non-linearity and large variation of the programming operation at these higher resistances use an iterative programming process with many programming pulses, leading to slow training performance and poor energy efficiency.

For the output result to be accurate, the resistance of the IMC memory cells in the Read operation in which a low voltage (smaller than 1V) is applied to the BL terminal, which is used in the inference mode, is to be linear with respect to the input voltages $V_0, V_1, \ldots, V_n$ of Equation (1). That is, the resistance values should not depend on the input voltage values. Besides linearity, the IMC cells' resistance variation with respect to temperature and fabrication processes should track with that of the resistor $R_{ADC}$ in the analog-to-digital converters if the ratios $R_{ADC}/R_{00}$, $R_{ADC}/R_{01}, \ldots, R_{ADC}/R_{0n}$ are to remain constant with temperature and fabrication processes. If this is not the case, the output result will be different at different operating temperatures and processes even when the input remains the same.

Similarly, to be highly reliable in training and inference mode, outputs with the same input calculated by the IMC ENVM array should be the same with respect to time and temperature. This is not always possible for RRAM and other emerging or traditional non-volatile memory technologies, as the resistance of the cells changes over time. Moreover, this effect becomes even worse at higher temperatures. The overall change in time is called the retention issue. Cells that experience many adjusting cycles during the training process also wear out, which is called the endurance issue, further exacerbating the retention issue.

In order to achieve a DNN training speed that will be useful for future ENVM DNN edge devices, improvement in the programming speed for multiple bits-per-cell RRAM where the resistance of a cell is set into a resistance range according to the data stored in that cell is to be obtained. For example, for a 3 bits-per-cell RRAM, the resistance of a cell may be set into one of 8 analog resistance ranges. In this case, a Sigma-Based Allocation (SBA) technique may be used in which the widths of the resistance ranges are not uniform, but narrower for lower ranges and wider for higher ranges to account for the fact that the variation in programming process is larger for higher target cell resistance. However, although this reduces the number of programming pulses, further improvement is desirable, especially for RRAM chips to use for DNN (e.g., 1 Mbits).

A programming algorithm called Range-Dependent Adaptive Resistance Tuning (RADAR) may be used in which the programming process is a combination of a coarse- and fine-grained RRAM resistance tuning. When compared against popular RRAM programing algorithms such as Increment Step Pulse Programming (ISPP) and Fixed Pulse Program-Verify (FPPV), RADAR provides a significant speed improvement. However, the number of programming pulses for RADAR under typical conditions is still about 35 pulses, which remains too large for the speed and energy consumption to be used for in-situ training in an edge device.

To reduce the number of programming pulses to one, in some embodiments the non-volatility function is physically separated from the resistance tuning function in a memory cell used as a synapse, and the synaptic value is quantized at the hardware level. FIG. 6A illustrates a traditional RRAM in accordance with some embodiments. Currently in IMC DNN devices based on traditional RRAM or ENVM, the memory cell (synapse) carries the non-volatility function (retaining the cell value even when the power is off) and the resistance tuning function in the same physical component of the cell. For example, the resistance of the traditional RRAM cell shown in FIG. 6A is tuned by adjusting the size of the conductive filament in the $HfO_2$ stack; if power is turned off, the filament size is expected to stay the same and thus its resistance is preserved. Both functions are kept in the same physical component, namely the $HfO_2$ stack. As above, a (slow) iterative process is used to adjust the resistance of the cell to the desired value R.

Figure 6B:
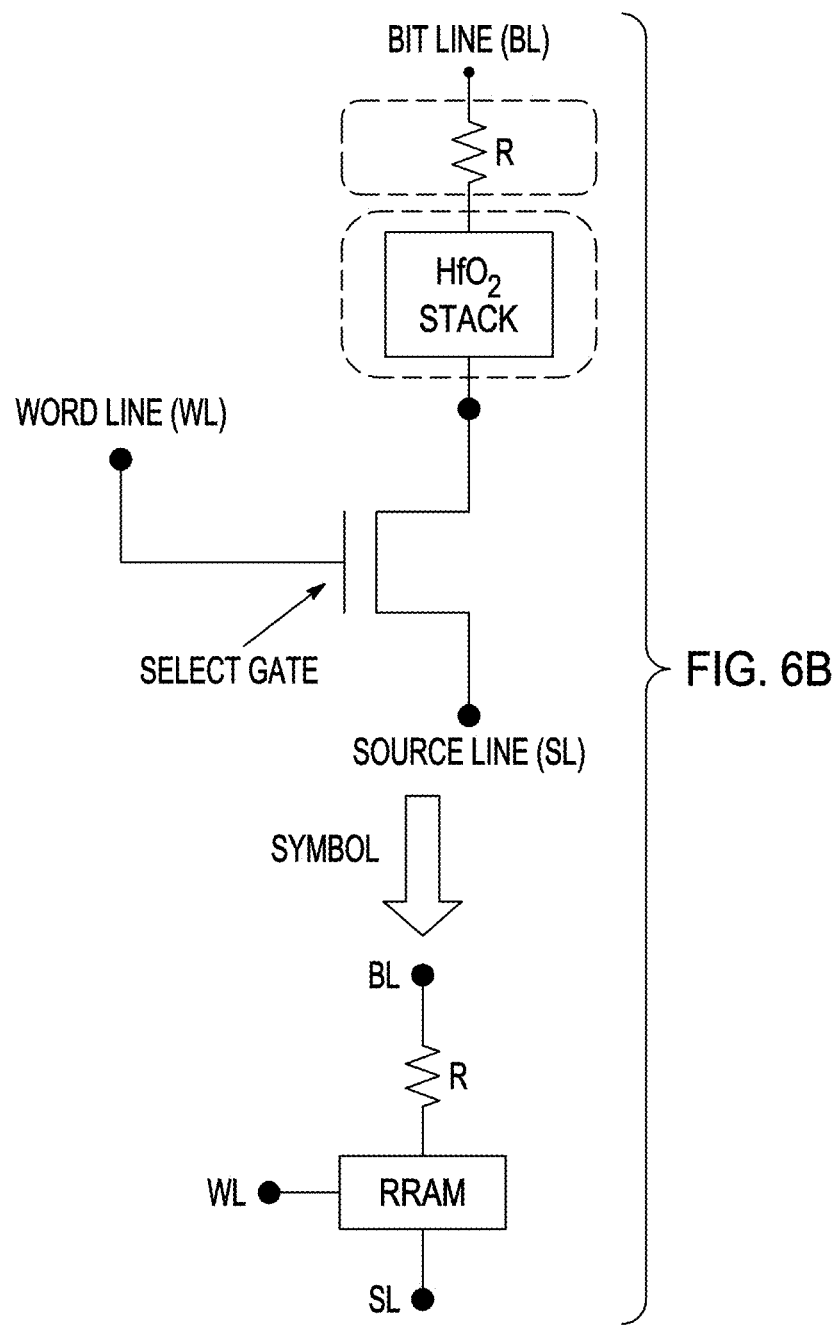
FIG. 6B illustrates a 1-bit-per-cell Resistance-In-Memory Random Access Memory (RIMRAM) in accordance with some embodiments.

FIG. 6B illustrates a RIMRAM in accordance with some embodiments. FIG. 6B illustrates an embodiment in which the non-volatility function is separated from the resistance tuning function, i.e., a real resistor with a pre-selected value R is used and the RRAM cell is now used solely as a switch. Thus, the RRAM cell is in either the low resistance state, which is small compared to R, or in the high resistance state which is large compared to R; no analog states are allowed in between these low and high resistance states. In this case, a single programming pulse is used to switch the RRAM cell from the high resistance state (the "0" state, also referred to as the off state or deactivated state) to the low resistance state (the "1" state, also referred to as the on state or activated state) and thus set the synaptic value to R. The RRAM cell in FIG. 6B performs a single function, the non-volatility function, acting as a switch; it is no longer used as an element to determine the resistance of the synapse. In the 1-bit RIMRAM cell of FIG. 6B, a real resistor R (referred to as the real resistor component of the RIMRAM cell) is connected on top of a traditional RRAM cell (called the RRAM component of the RIMRAM cell). In some embodiments, high sheet resistance materials can be used to fabricate the resistor in a multi-layer board, and the high sheet resistance materials can be laid out on top of the regular RRAM cell to reduce the cell area. For example, for certain materials, if R is 10KΩ, an area of only a single square is used (for example 0.2 μm×0.2 μm). Other materials (P-poly), which has a resistance of 2KΩ may also be used, although the cell area will be comparatively larger. The resistive layer containing the high sheet resistance materials may be fabricated in the multilayer structure containing the RIMRAM array (as above, vertically in the area of the RIMRAM cell itself) and may be connected to one of the metal layers (e.g., Ti) of the RRAM component through insulating and other layers using one or more vias.

The 1-bit RIMRAM cell in FIG. 6B represents only 2 possible weight values (the conductance values of the RIMRAM cell or RIMRAM synapse), either 0 (when the RRAM cell is in the off state) or G=1/R (when the RRAM cell is in the on state). This assumes that the resistance of the RRAM component is effectively infinite in the off state and 0 when the RRAM component is in the on state. The synaptic value is quantized at the hardware level.

Figure 6C:
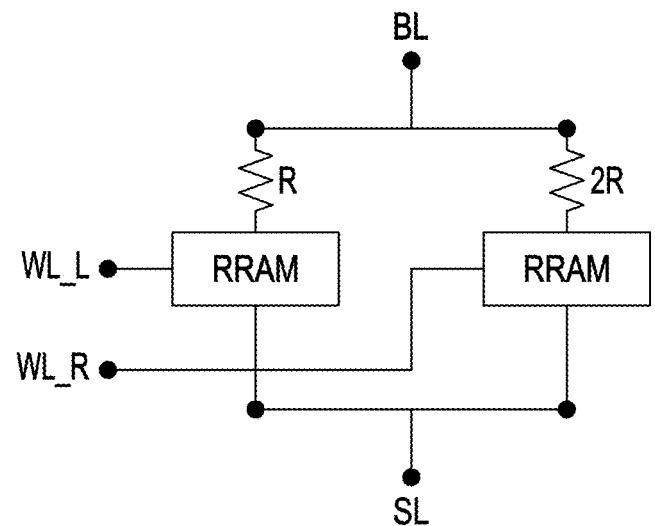
FIG. 6C illustrates a 2-bit-per-cell RIMRAM in accordance with some embodiments.

FIG. 6C illustrates a 2-bit RIMRAM in accordance with some embodiments. The 2-bit RIMRAM cell can provide 4 different conductance values 0, 1/(2R), 1/(R) and 1/(2R)+1/

(R), corresponding to 4 different combinations of the left- and right-hand RRAM components 00, 01, 10, and 11, respectively. In other words, if G is the minimum non-zero conductance 1/(2R), then the 4 conductance values ("weights") are 0, G, 2G, and 3G, and a uniform conductance quantization is thus achieved. Note that the equivalent conductance of the 2 branches connected in parallel is simply the sum of each branch's conductance, per Ohm's law. To create negative weights, a differential technique discussed below may be normally used. For many DNN applications, a 1-bit quantized synapse is adequately accurate, but the 2-bit synapse in FIG. 6C may achieve better accuracy and can thus be used in a wider range of DNN applications. Simulation results for a DNN system used to identify handwritten digits (known as a MNIST system) show that an accuracy of 98.0% can be achieved using 2-bit quantization and the differential technique, very close to the reference accuracy (no quantization) of 98.9%. These results were the average of five consecutive training and testing runs using TensorFlow, a popular platform for machine learning.

Figure 6D:
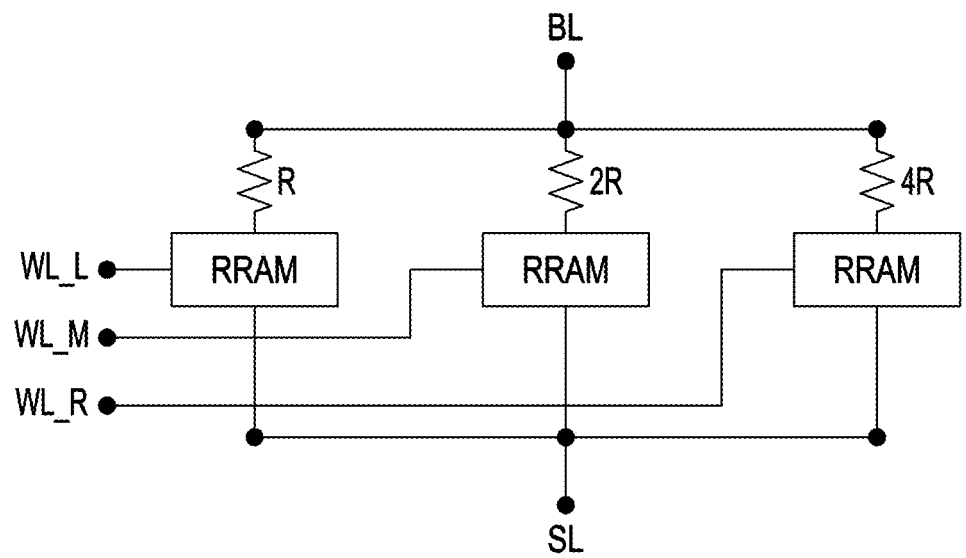
FIG. 6D illustrates a 3-bit-per-cell RIMRAM in accordance with some embodiments.

FIG. 6D illustrates a 3-bit RIMRAM in accordance with some embodiments. The arrangement shown in FIG. 6D supports higher accuracy applications, at the cost of increased cell area. Note that switches to support programming the RRAM cells to the on and off state are not shown in FIGS. 6A-6D. The various switches herein may be implemented in some embodiments as field effect transistors (FETs) or bipolar junction transistors (BJTs), for example.

In practice, arrays of different sizes may be used, including small arrays (4×4, 8×8, 16×16, etc.) of RIMRAM cells, with different combinations of bits for RIMRAM (1-bit, 2-bit and 3-bit RIMRAM), of resistance value R, and of the size of the select gate. These designs include other switches to ensure the RIMRAM cell works correctly for both read mode (inference mode) and for programming mode (training mode). The RIMRAM arrays may be fabricated using commercial RRAM and 130 nm compound metal oxide semiconductor (CMOS) processes.

A RIMRAM cell's resistance is made up of two components, namely the resistance of the RRAM component (i.e., the switch) and the equivalent resistance R of the real resistor component (one or several real resistors connected in parallel). The resistance of the RRAM component is substantially smaller than R if the RRAM component is in the on state (i.e., the switch formed by the RRAM component is on) and is substantially larger than R if the RRAM component is in the off state (the switch is off). For example, if R is desired to be around 10KΩ, the resistance of the RRAM cell in the on state is considered good if it is less than 2KΩ2. This represents a 20% error added to the real resistance of 10KΩ, which can be compensated for as discussed in more detail below. In other examples, the resistance of the RRAM cell may be limited to less than 1%, 5%, 10%, 20%, 30% of the resistance of the resistor. This limitation may be dependent on the error-tolerance level of the application (between the on and off states of the RRAM cell). A higher error-tolerance level may allow a reduction in the number of pulses to program the RRAM cell, thereby trading between accuracy and speed of programming. For example, programming of the weights of a neural network may not be particularly accurate, leading to increased speed. Moreover, in some cases, the overall compensate by using combination of RRAM and R. Accordingly, the term "substantially" means a minimum of a factor of two (in the above example, a factor of 5 when the RRAM component is on and a factor of 10 when the RRAM component is off).

While there is a risk that the resistance of the RRAM cell may not fall below 2KΩ when only one programming pulse is used, setting the RRAM cell to a relatively low resistance (e.g., below a few KΩ) is predictable and the standard variation is small. Thus, even in a large array of tens of thousands of RRAM cell, only a small percentage of RRAM cells is likely to be affected, thereby leaving the overall performance of the entire array unaffected.

If ensuring that the RRAM cells are properly programmed and the programming speed is otherwise sufficient, a verification pulse may be used to mitigate this effect by permitting a determination of whether or not the resistance of the RRAM component to which a programming pulse has been supplied (and thus is intended to be in the on state) is at or below the desired resistance (e.g., 2KΩ). In this case, an additional programming pulse may be applied to the small percentage of RRAM cells whose resistance has not decreased to the desired level to reduce the resistance, which should reduce the resistance of these RRAM cells to at or below the desired resistance. When applying another programming pulse, the additional programming pulse may have the same characteristics as the original programming pulse and verification pulse may be used in some embodiments; in other embodiments the programming pulse duration may be reduced and/or a followup verification pulse may not be used due to the vanishingly small likelihood of the RRAM cell resistance not being below the desired resistance.

Alternatively, rather than using an additional programming pulse, the higher resistance of the RRAM component may be compensated for. For example, if the desired resistance of a RIMRAM cell is 10KΩ, and the RRAM component resistance is 2KΩ, the resistance of the real resistor component can be designed to be 8KΩ rather than 10KΩ. The resistance of an RRAM component in the on state can be estimated by using the mean resistance of a large number of RRAM components in the on state, which may be obtained during a characterization process. A similar risk may occur for the RRAM components that are to be in the off state, which will be discussed in more detail below. There is also a small risk that this could affect some of the RRAM cells in the on state when in read mode, known as the "read disturb" issue, increasing the resistance beyond the desired resistance in the on state. To mitigate this effect, the input voltages applied to the BL terminal of the RRAM component during the read operation may be limited to avoid disturbing the resistance of the RRAM cells in the on state.

As above, measures are also taken to avoid RRAM synapses suffering from the retention issue, i.e., when the synapse resistance set during the programming process does not stay the same but varies with time, adversely affecting the accuracy of the training and inference operations. This issue is particularly severe when the RRAM synapse is used as an analog component where many analog resistance levels can be set, and thus any shift in the resistance value of traditional RRAM cells will affect the reliability of the IMC ENVM DNN array.

To mitigate this issue, the RIMRAM cell operates in a digital manner instead of an analog manner. In a RIMRAM cell, since the real resistor component is responsible for setting the resistance of the RIMRAM cell when the RRAM component is in the on state, the RRAM component of the RIMRAM cell operates in a digital manner, switching between the on state and the off state. Thus, if the RRAM component resistance drifts over time, the effect of retention on the accuracy of the IMC ENVM DNN array is significantly reduced as long as the RRAM component is still in the high resistance off state, where the RRAM component resistance is much larger than that of the real resistor component, or in the low resistance on state, where the RRAM component resistance is much smaller than that of the real resistor component. The resistance of the real resistor component does not change with time since this component is made by real resistors, not by a non-volatile memory cell like a NOR flash cell or an RRAM cell. This makes the RIMRAM cell robust with respect to the retention issue.

The operation of the RRAM component in a digital mode permits separation of the resistance tuning function (the real resistor component) from the non-volatile function (the RRAM component). Thus, implementation of RIMRAM cell operation in a digital manner may avoid the use of additional switches to the design, thereby reducing the amount of additional chip area used. The RIMRAM cell is also robust with respect to endurance issue because if operated in a digital manner, only a single programming pulse, rather than tens or hundreds of programming pulses, may be used, substantially reducing wear on the RIMRAM cell during the training mode.

Besides mitigating the retention and endurance issues, it is desirable to create a highly accurate RIMRAM cell for operation in the inference (read) mode with respect to temperature as well as resistant to variations during fabrication. Looking again at Equation (1), if the reference resistor $R_{ADC}$ of the ADC is formed using the same materials (and perhaps on the same layers of the multilayer structure) as the synapse resistors $R_{00}, R_{01}, \ldots, R_{0n}$, then all the resistance ratios in Equation (1) remain constant regardless of variations in the temperature or fabrication processes because the values of the ratios are simply the geometric size ratios of the resistors. The real resistor component of the RIMRAM cell can be matched to the same resistor type as the ADC, which is advantageous over traditional IMC cells lack since the resistance of these memory cells does not track that of the reference resistor in the ADC. This allows the resistors in the ADC to be used as tracking resistors to eliminate variations and substantially increase accuracy.

Thus, arrays (such as 4×4, 8×8, 16×16, although larger sizes and non-square arrays may be used) of RIMRAM cells may be fabricated using commercial RRAM/CMOS processes in which the ADCs have the same resistor type as that of the real resistor component in the RIMRAM cell. Voltage conditions and resistance ranges are defined to set RRAM cells in the on and off states.

As with RRAM cells, the RRAM component of the RIMRAM cells is not expected to suffer from retention issues in the on state (the low resistance state). In some embodiments, the high resistance off state is defined as 100KΩ, which is considered significantly greater than the resistive component as it is a factor of 10 greater than a desired 10KΩ resistance of the RIMRAM cell in the on state and may be affected more by the retention issue. The resistance of some small percentage of the RIMRAM cells in the off state may drop below 100KΩ, from their initial programmed value of, say, 120KΩ. For these cells, two or more programming pulses can be applied to bring their resistance back to well above the programmed resistance (in this example 120KΩ). For example, the use of multiple programming pulses may raise the resistance by up to about 50% greater than the original programmed resistance (in this example, 150KΩ), to establish a greater margin against the retention degradation. As above, it is expected that the percentage of RIMRAM cells suffering from degradation is small, using two programming pulses for these cells should not affect the overall performance of the array as a whole.

Alternatively, or in addition, a single pulse may be used to program all RIMRAM cells but using stronger voltage conditions. In this case, however, care must be taken to ensure that the voltage conditions used during programming are strong enough to cause any of the RIMRAM cells to become stuck in the off state.

Alternatively, or in addition, re-programming may be periodically performed for all of the RIMRAM cells in the off state to restore (refresh) the retention margin to bring them back to the original programmed resistance (as in the example above, 120KΩ. The refresh operation may be performed at a rate of once per month to once per year (or years), which is relatively infrequent (compared to DRAM refresh rates of every 50 µs or so) and may not significantly affect the overall performance of the RIMRAM array. The conductance (weight) of a RRAM component in the off state does not change much if its resistance is relatively large, leading to the low refresh rate. For example, if the resistance changes from 120KΩ 100KΩ, the conductance changes only from 8.3 µS to 10 µS (G=1/R). This is the nature of the 1/R function. For large values of R, the slope of the function 1/R is small.

Figure 7A:
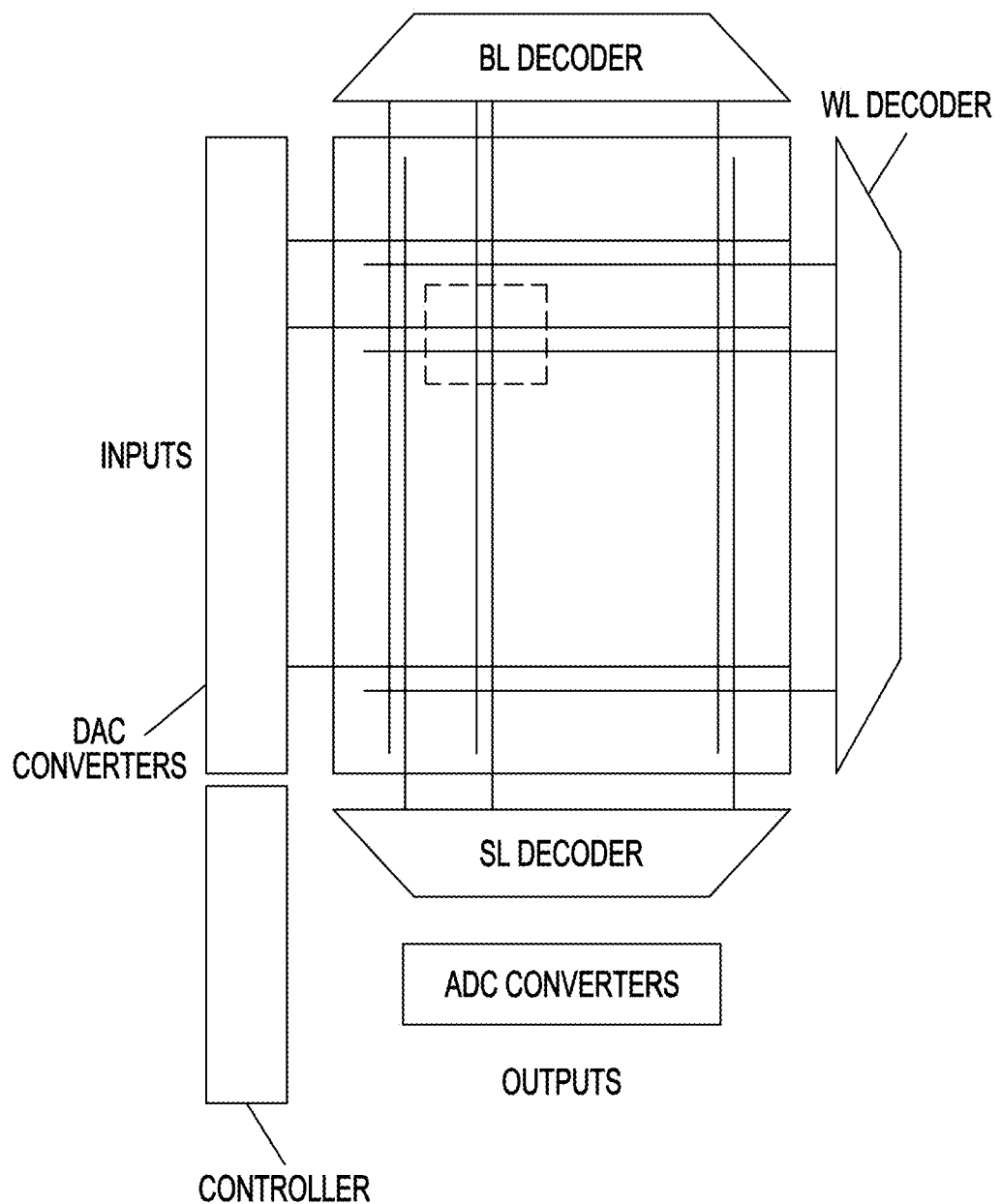
FIG. 7A illustrates a RIMRAM chip in accordance with some embodiments.

FIG. 7A illustrates a RIMRAM chip in accordance with some embodiments. Only some of the circuitry in the RIMRAM chip are shown, including the DAC and ADCs, BL, SL and WL decoders, and controller that controls operation of the RIMRAM chip. As shown, inputs are provided to the DAC converters to convert digital inputs to analog currents during the programming mode. The resulting summed currents from RIMRAM cells along each of the SLs are decoded and translated into a digital signal using the ADCs.

Figure 7B:
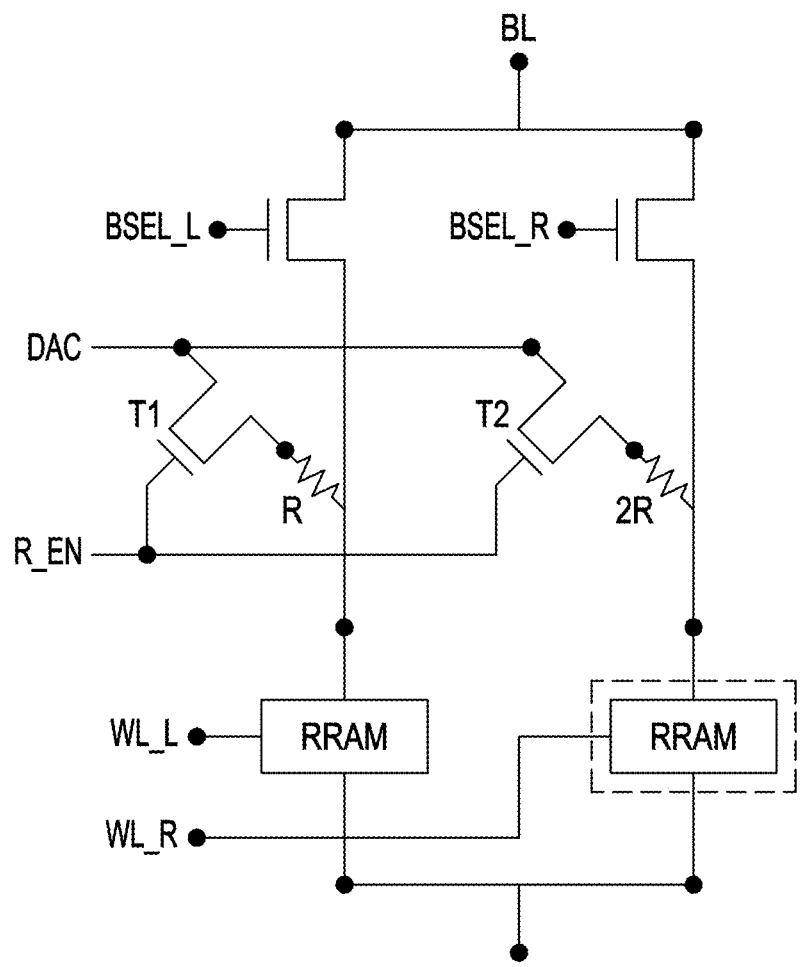
FIG. 7B illustrates a 2-bit-per-cell RIMRAM in accordance with some embodiments.

The array shown in FIG. 7A may contain multi-bit RIMRAM cells. For example, the multi-bit RIMRAM cells may be 2-bit RIMRAM cells. FIG. 7B illustrates a 2-bit RIMRAM cell in accordance with some embodiments. The RIMRAM cell shown in FIG. 7B is indicated as the dotted circle in FIG. 7A and includes read select switches T1 and T2. Each of the read select switches T1 and T2 is connected between a DAC line and a resistor to which the RRAM component is connected. The RRAM components are connected with the same SL line. The read select switches T1 and T2 are connected to the same DAC line (the DAC line from one of the DACs). The resistances of the resistors are integer multiples of the minimum resistance among the resistors, within a specified tolerance of, say 10%.

As shown, a wordline (WL_L or WL_R) is connected to the control gate of a respective wordline of a pair of wordline switches and is activated in both the read and programming mode. A bitline select line (BLSEL_L or BLSEL_R) is connected to an input gate of a respective bitline select switch of a pair of bitline select switches and is activated in only the programming mode. An input line (DAC) is connected to a pair of read select switches and is activated in only the read mode. A bit line (BL) is also connected to the RIMRAM cell via the pair of bitline select switches.

Figure 7C:
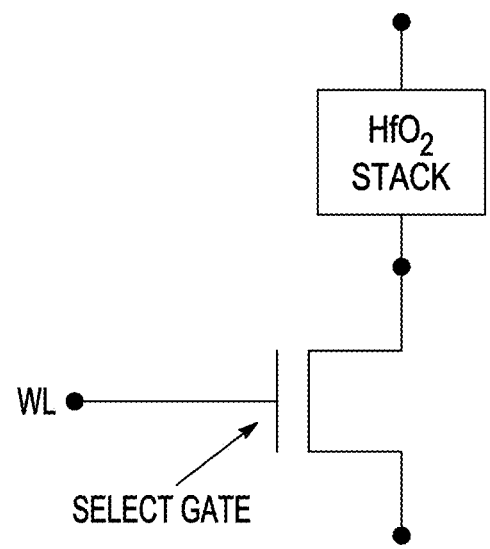
FIG. 7C illustrates a RRAM component of the 2-bit-per-cell RIMRAM in accordance with some embodiments.

The read select switches T1 and T2 are enabled by a read enable signal R-EN only in the read mode, in which the currents of the RIMRAM synapses are accumulated along the SL line. During read mode, the DAC signal is connected to a DAC converter, and the wordline left or right signals WL_L and WL_R are used to select the left or right branch, respectively. FIG. 7C illustrates a RRAM component of the 2-bit RIMRAM cell in accordance with some embodiments.

As shown in FIG. 7C, the _L and WL_R are applied to the control terminal (e.g., gate) of the wordline switch of the RRAM component. An output terminal of each wordline switch is connected to the SL decoder. During the read mode, WL_L and WL_R are connected to a power supply, e.g., about 5V, and SL is biased to a low voltage such as 0.2V.

During the programming mode (the SET or RESET operations), the read enable signal R_EN is set to 0V. This effectively disables the resistor as no current flows through the resistor. To select the left or right RRAM component shown in FIG. 7B for programming, signals BLSEL_L, WL_L, BLSEL_R, WL_R are used to enable the BL to be connected to the desired RRAM component through BLSEL_L or BLSEL_R switches. For example, if the left RRAM component is selected in the SET operation, the voltage conditions may be BL=1.5V, BLSEL_L=VDD (supply voltage, ~5V typically), WL_L=1.5V, SL=0V (typical values); if the left RRAM component is selected in the RESET operation, the conditions are BL=0V, BLSEL_L=VDD, WL_L=4V, SL=2.5V. If the right RRAM component is selected, voltage conditions are similar, except that BLSEL_R and WL_R are used.

In some embodiments, to reduce the area of the RIMRAM cell, read select switches T1 and T2 can be replaced by p-n junction diodes. In addition, the select gate of the left RRAM component can be shared with that of the right RRAM component, hence the 2-bit RIMRAM cell may use only a single RRAM select gate.

Figure 8:
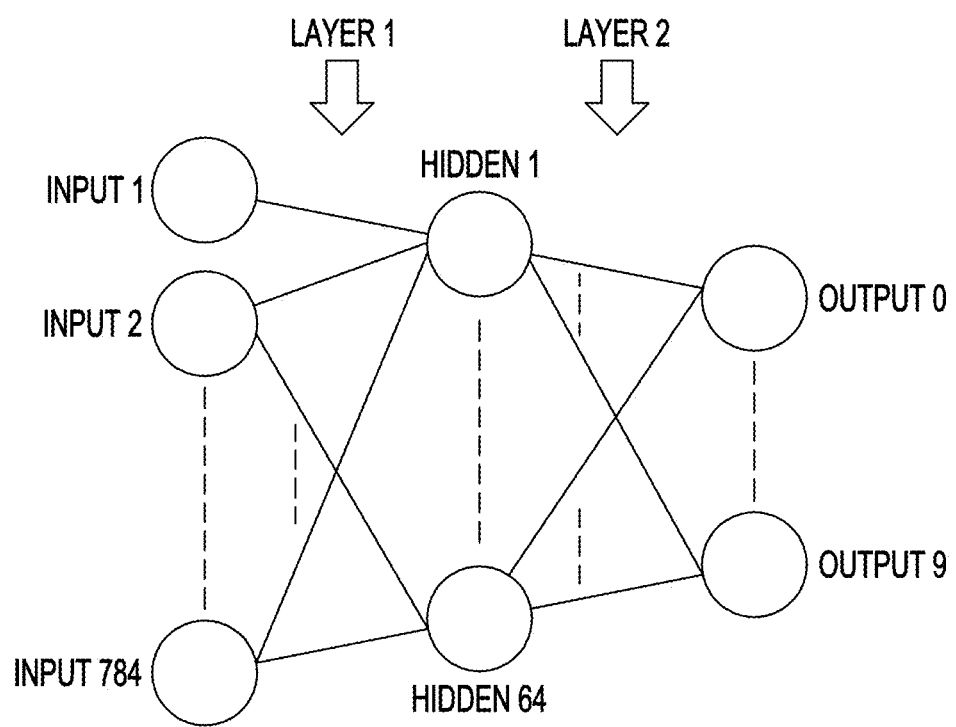
FIG. 8 illustrates a Modified National Institute of Standards and Technology (MNIST) 2-layer neuron network in accordance with some embodiments.

FIG. 8 illustrates a MNIST 2-layer neuron network in accordance with some embodiments. The neuron network as shown in FIG. 8 contains input nodes, hidden nodes, a first layer of weights between the input nodes and the hidden nodes, output nodes, and a second layer of weights between the output nodes and the hidden nodes. In practice, multiple sets of hidden nodes and layers between the hidden nodes may be present. The neuron network uses the RIMRAM array of FIG. 7A and may be used for any desired application. For example, for handwritten digit recognition, the size of an image of a handwritten digit in the MNIST dataset may be 28 pixels by 28 pixels (28×28). This leads to 28 times 28=784 input neurons in the array of FIG. 8. The number of hidden nodes may be 64 and the number of output nodes may be 10. To reduce the network size, the number of input nodes may be reduced by down sampling the image (e.g., to 14×14 or 7×7). If a 7×7 input is used and the number of hidden neurons is kept the same as in the 28×28 array at 64, the number of weights for the first layer is 49×64=3136 and the number of weights for the second layer is 64×10=640, hence the total number of weights is 3136+640=3776.

In this case, an array of 4096 2-bit RIMRAM cells would suffice to provide the neural network. However, for an MNIST model, both positive and negative weights are used, so double the number of RIMRAM cells are used, i.e., 8192 cells.

Figure 9A:
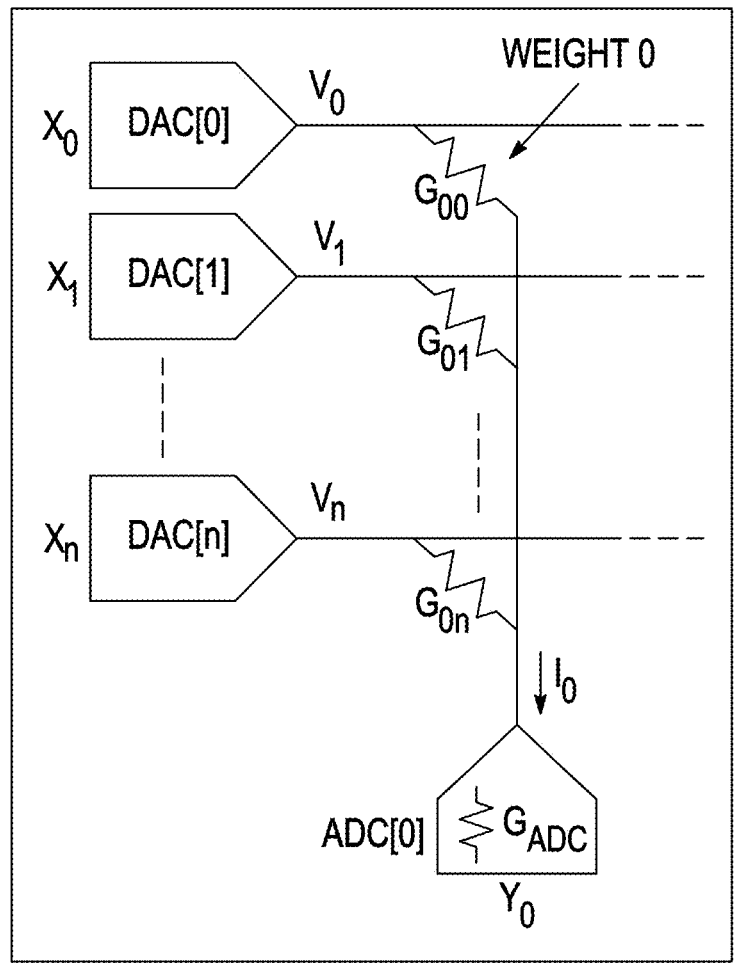
FIG. 9A illustrates a single-cell weight in accordance with some embodiments.
Figure 9B:
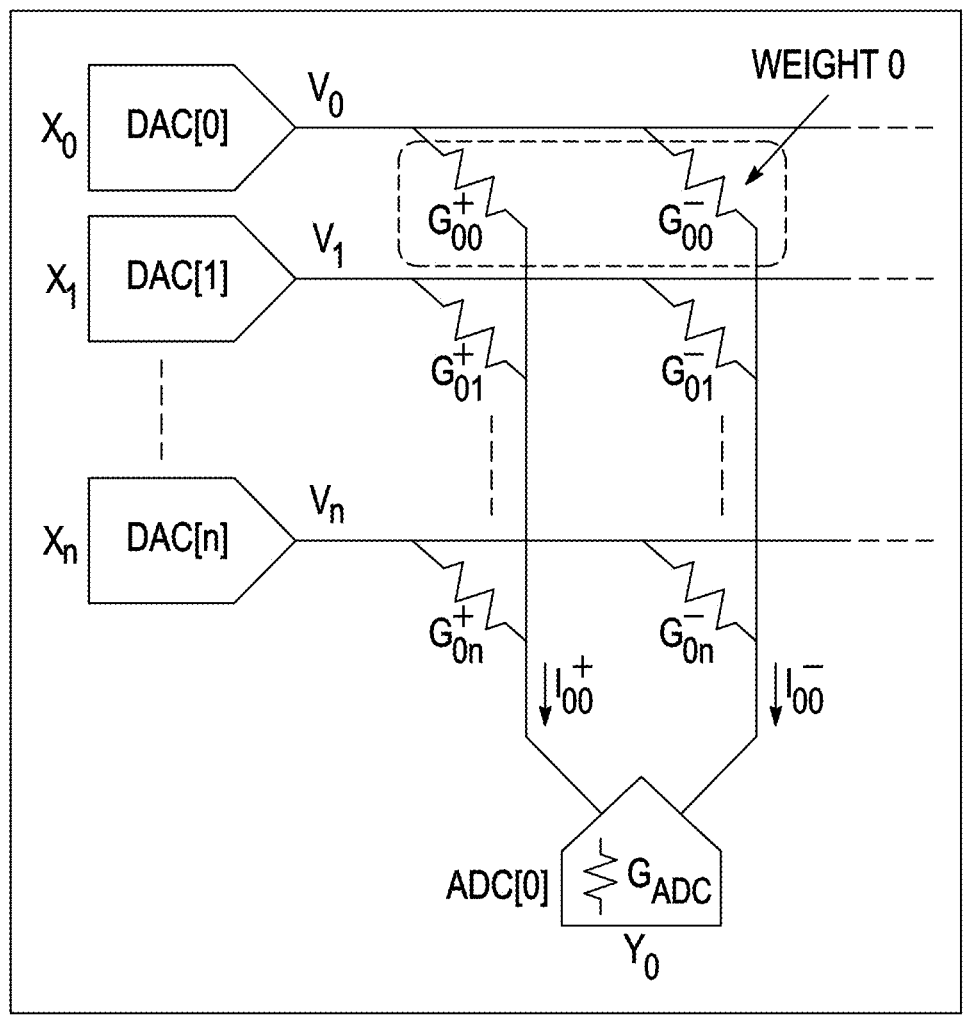
FIG. 9B illustrates a double-cell weight in accordance with some embodiments.

FIG. 9A illustrates a single-cell weight in accordance with some embodiments. If only positive weights are used, a single cell is used for each weight. For example, in FIG. 9A weight 0 is represented by the conductance $G_{00}$, and the current running through this synapse is $V_0 G_{00}$. FIG. 9B illustrates a double-cell weight in accordance with some embodiments. To represent a negative weight, 2 cells with conductance $G_{00}^+$ and $G_{00}^-$ are used, as shown in FIG. 9B, and the current contributed by this weight is $V_0(G_{00}^+ - G_{00}^-)$, i.e., the weight is represented by the difference in conductance of two corresponding cells (differential technique). As mentioned above, a 2-bit RIMRAM cell with the real resistor component being composed of 2 resistors, R and 2R can represent a synaptic weight with 4 values 0, G, 2G and 3G, where G=1/(2R). With two 2-bit RIMRAM cells connected in the differential structure, a synaptic weight (for example Weight 0 shown in FIG. 9B), can represent the values −3G, −2G, −G, 0, G, 2G and 3G. To select the quantized values of Weight 0 in FIG. 9B, consider Equation (1): $VOUT_0 = V_0(R_{ADC}/R_{00}) + \ldots + V_0(R_{ADC}/R_{0n})$, or equivalently $VOUT_0 = V_0(G_{00}/G_{ADC}) + \ldots + V_0(G_{00}/G_{ADC})$ if conductance symbols are used. If $G_{ADC}$ is chosen to be 10G, then the first ratio ($G_{00}/G_{ADC}$), as well as the remaining ratios, can represent the values −0.3, −0.2, −0.1, 0, 0.1, 0.2, 0.3. Simulation shows that the accuracy of a MNIST network with the quantized values of −0.3, −0.2, −0.1, 0, 0.1, 0.2, 0.3 can achieve 98% accuracy, which is close to the reference accuracy of 98.9% (without quantizing) using the LeNet-5 DNN model.

Figure 10:
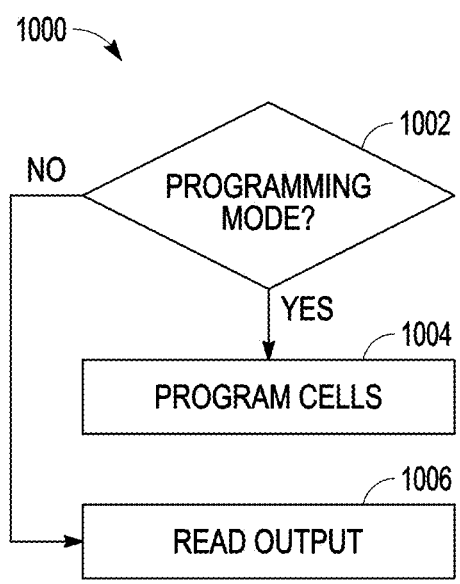
FIG. 10 illustrates a method of operating a memory array, in accordance with some embodiments.

FIG. 10 illustrates a method of operating a memory array, in accordance with some embodiments. The method 1000 of FIG. 10 is merely exemplary; additional operations not shown may be present. At least some of the operations of the method 1000 may be performed by the memory array, which includes non-volatile memory cells that each have a non-volatile memory and a switch. The method 1000 begins at operation 1002 where further operations depend on whether the memory array is in programming mode or in reading mode.

In a programming mode, each of the non-volatile memory cells, which is coupled to a different resistor, is programming into an on state or an off state at operation 1004. In the on state, a resistance of the non-volatile memory is substantially less than the resistance of the resistor to which the non-volatile memory cell is connected. In the off state, the resistance of the non-volatile memory is substantially greater than the resistance of the resistor to which the non-volatile memory cell is connected.

In a reading mode, an output along a plurality of output lines is read at operation 1006. Each output line is coupled to a plurality of input lines. Each input line is associated with one of the non-volatile memory cells for the output line such that each of the non-volatile memory cells in the on state provides a contribution to the output and each of the non-volatile memory cells in the off state provides essentially no contribution to the output.

Examples

Example 1 is a memory array comprising: a plurality of wordlines; a plurality of input lines; and a plurality of Resistance-In-Memory Random Access Memory (RIM-RAM) cells coupled to the plurality of wordlines and the plurality of input lines, each RIMRAM cell comprising a resistor and a non-volatile memory cell coupled to an associated wordline and input line, each non-volatile memory cell comprising a switch and a non-volatile memory coupled between one of the resistors and the switch, each wordline connected to a control terminal of a different switch.

In Example 2, the subject matter of Example 1 includes, wherein the non-volatile memory comprises a Resistive RAM (RRAM).

In Example 3, the subject matter of Examples 1-2 includes, wherein the resistor is formed from high sheet resistance material having a resistance of at least about 10 ohms/square.

In Example 4, the subject matter of Examples 1-3 includes, wherein in a programming mode, each non-volatile memory is programmable between: an on state in which a resistance of the non-volatile memory is substantially less than the resistance of the resistor to which the non-volatile memory cell is connected, and an off state in which the resistance of the non-volatile memory is substantially greater than the resistance of the resistor to which the non-volatile memory cell is connected.

In Example 5, the subject matter of Example 4 includes, a plurality of bitlines coupled with the non-volatile memory cells, wherein in the programming mode, each bitline is coupled to at least one of the non-volatile memory cells through a bitline select switch.

In Example 6, the subject matter of Examples 1-5 includes, wherein in a read mode, each input line is coupled to each resistor of a set of the resistors through a different read enable switch, each resistor coupled to a different one of the non-volatile memory cells.

In Example 7, the subject matter of Examples 1-6 includes, wherein in a read mode, each input line is coupled to each resistor of a set of the resistors through a different read enable diode, each resistor coupled to a different one of the non-volatile memory cells.

In Example 8, the subject matter of Examples 1-7 includes, wherein: each input line is coupled to a different digital-to-analog converter, each of a set of non-volatile memory cells connected to different input lines is coupled to an analog-to-digital converter, and resistors in the analog-to-digital converters are formed from identical material as the resistors in the RIMRAM cells.

In Example 9, the subject matter of Examples 1-8 includes, wherein: each input line is coupled to a set of the non-volatile memory cells through a different resistor, each of the non-volatile memory cells of the set of the non-volatile memory cells is connected with a same source line, and each of the resistors coupled to a particular input line and non-volatile memory cell has a different resistance.

In Example 10, the subject matter of Example 9 includes, wherein each of the resistors coupled to the particular input line has a resistance value that represents an integer multiple of a least resistance value among the resistors coupled to the particular input line.

In Example 11, the subject matter of Examples 9-10 includes, wherein each of the resistors coupled to the particular input line has a resistance value that represents $2^n$ of a least resistance value among the resistors coupled to the particular input line, where n is a non-negative integer.

In Example 12, the subject matter of Examples 1-11 includes, wherein the resistors and resistors of analog-to-digital converters to which the resistors are coupled comprise a same material to minimize variations caused by temperature and fabrication processes.

Example 13 is a method of operating a memory array comprising non-volatile memory cells that each comprise a non-volatile memory and a switch, the method comprising: in a programming mode, programming each of the non-volatile memory cells, which is coupled to a different resistor, into a state selected from: an on state in which a resistance of the non-volatile memory is substantially less than the resistance of the resistor to which the non-volatile memory cell is connected, and an off state in which the resistance of the non-volatile memory is substantially greater than the resistance of the resistor to which the non-volatile memory cell is connected; and in a reading mode, reading an output along a plurality of output lines, each output line coupled to a plurality of input lines, each input line associated with one of the non-volatile memory cells for the output line such that each of the non-volatile memory cells in the on state provides a contribution to the output and each of the non-volatile memory cells in the off state provides essentially no contribution to the output.

In Example 14, the subject matter of Example 13 includes, in the programming mode, coupling each of a plurality of bitlines to at least one of the non-volatile memory cells through a bitline select switch without using the resistor to which each of the at least one of the non-volatile memory cells is coupled.

In Example 15, the subject matter of Examples 13-14 includes, in the read mode, coupling each of the input lines to at least one of the resistors through a read enable switch for each of the at least one of the resistors.

In Example 16, the subject matter of Examples 13-15 includes, converting an input digital voltage for each input line into an analog current; supplying the analog current from each input line to a set of the non-volatile memory cells associated with one of the output lines; and for each output line, converting the analog current of the non-volatile memory cells in the on state in the set of the non-volatile memory cells into an output digital voltage.

In Example 17, the subject matter of Examples 13-16 includes, supplying an analog current from each input line to a set of the non-volatile memory cells associated with one of the output lines, each of the input lines coupled to the one of the output lines through multiple non-volatile memory cells and resistors having different resistances.

In Example 18, the subject matter of Example 17 includes, wherein for each output line, each of the resistors coupled to a particular input line has a resistance value that represents an integer multiple of a least resistance value among the resistors coupled to the particular input line.

In Example 19, the subject matter of Example 18 includes, wherein each of the resistors coupled to the particular input line has a resistance value that represents $2^n$ of a least resistance value among the resistors coupled to the particular input line, where n is a non-negative integer.

In Example 20, the subject matter of Examples 13-19 includes, forming each resistor, and resistors in analog-to-digital converters to which the output lines are coupled, from high sheet resistance materials having a resistance of at least about 10 ohms/square.

Example 21 is a non-transitory computer-readable storage medium that stores instructions for execution by one or more processors, the one or more processors configured to, when the instructions are executed operate a memory array comprising non-volatile memory cells that each comprise a non-volatile memory and a switch by: in a programming mode, programming each of the non-volatile memory cells, which is coupled to a different resistor, into a state selected from: an on state in which a resistance of the non-volatile memory is substantially less than the resistance of the resistor to which the non-volatile memory cell is connected, and an off state in which the resistance of the non-volatile memory is substantially greater than the resistance of the resistor to which the non-volatile memory cell is connected; and in a reading mode, reading an output along a plurality of output lines, each output line coupled to a plurality of input lines, each input line associated with one of the non-volatile memory cells for the output line such that each of the non-volatile memory cells in the on state provides a contribution to the output and each of the non-volatile memory cells in the off state provides essentially no contribution to the output.

In Example 22, the subject matter of Example 21 includes, wherein the one or more processors further configured to, when the instructions are executed: coupling, in the programming mode, each of a plurality of bitlines to at least one of the non-volatile memory cells through a bitline select switch without using the resistor to which each of the at least one of the non-volatile memory cells is coupled, and in the read mode, coupling each of the input lines to at least one of the resistors through a read enable switch for each of the at least one of the resistors.

Example 23 is a Deep Neural Network (DNN) comprising: a plurality of input nodes; a plurality of output nodes; and weights provided between the input nodes and the output nodes, the weights provided by a memory array, the memory array comprising a plurality of non-volatile memory cells, each non-volatile memory cell having a non-volatile memory coupled to a switch, each non-volatile memory cell coupled to: a wordline coupled to the switch for selection of the non-volatile memory cell, an input line to provide a current to the non-volatile memory cell through a resistor, and an output line to which the non-volatile memory cell provides a current component of an output dependent on whether the non-volatile memory cell is in an on state, in which a resistance of the non-volatile memory is substantially less than the resistance of the resistor to which the non-volatile memory cell is connected, or an off state, in which the resistance of the non-volatile memory is substantially greater than the resistance of the resistor to which the non-volatile memory cell is connected.

In Example 24, the subject matter of Example 23 includes, wherein: the memory array further comprises a plurality of bitlines coupled with the non-volatile memory cells, in a programming mode, each bitline is coupled to at least one of the non-volatile memory cells through a bitline select switch, and in a read mode, each input line is coupled to at least one of the resistors through a read enable switch, each resistor coupled to a different one of the non-volatile memory cells.

In Example 25, the subject matter of Examples 23-24 includes, wherein in the memory array: each input line is coupled to a set of the non-volatile memory cells through a different resistor, and each of the resistors coupled to a particular input line and non-volatile memory cell has a different resistance.

Example 26 is an edge device comprising a Deep Neural Network (DNN), the DNN comprising: a plurality of input nodes; a plurality of output nodes; and weights provided between the input nodes and the output nodes, the weights provided by a memory array, the memory array comprising a plurality of non-volatile memory cells, each non-volatile memory cell having a non-volatile memory coupled to a switch, each non-volatile memory cell coupled to: a wordline coupled to the switch for selection of the non-volatile memory cell, an input line to provide a current to the non-volatile memory cell through a resistor, and an output line to which the non-volatile memory cell provides a current component of an output dependent on whether the non-volatile memory cell is in an on state, in which a resistance of the non-volatile memory is substantially less than the resistance of the resistor to which the non-volatile memory cell is connected, or an off state, in which the resistance of the non-volatile memory is substantially greater than the resistance of the resistor to which the non-volatile memory cell is connected.

In Example 27, the subject matter of Example 26 includes, wherein: the memory array further comprises a plurality of bitlines coupled with the non-volatile memory cells, in a programming mode, each bitline is coupled to at least one of the non-volatile memory cells through a bitline select switch, and in a read mode, each input line is coupled to at least one of the resistors through a read enable switch, each resistor coupled to a different one of the non-volatile memory cells.

In Example 28, the subject matter of Examples 26-27 includes, wherein in the memory array: each input line is coupled to a set of the non-volatile memory cells through a different resistor, and each of the resistors coupled to a particular input line and non-volatile memory cell has a different resistance.

Example 29 is a memory array comprising: a plurality of non-volatile Random Access Memory (RAM) cells each comprising a first switch and a non-volatile memory coupled with the first switch, the first switch configured to be activated in each of a programming and read mode to respectively program and read the non-volatile memory; and a plurality of Resistance-In-Memory RAM (RIMRAM) cells each comprising a second switch, a third switch, a unique one of the non-volatile memories, and a resistor coupled between the second switch and the unique one of the non-volatile memories, the second switch configured to be activated in the read mode to read the unique one of the non-volatile memories, the third switch configured to be activated in the programming mode to program the unique one of the non-volatile memories.

In Example 30, the subject matter of Example 29 includes, wherein the resistors are formed from high sheet resistance material having a resistance of at least about 10 ohms/square.

In Example 31, the subject matter of Example 30 includes, analog-to-digital converters (ADCs) coupled to the non-volatile memories, the resistors and resistors of the ADCs formed from the high sheet resistance material to minimize variations caused by temperature and fabrication processes.

In Example 32, the subject matter of Examples 29-31 includes, wherein in the programming mode, each non-volatile memory is programmable between: an on state in which a resistance of the non-volatile memory is substantially less than the resistance of the resistor to which the non-volatile memory cell is connected, and an off state in which the resistance of the non-volatile memory is substantially greater than the resistance of the resistor to which the non-volatile memory cell is connected.

Example 33 is at least one machine-readable medium including instructions that, when executed by processing circuitry, cause the processing circuitry to perform operations to implement of any of Examples 1-32.

Example 34 is an apparatus comprising means to implement of any of Examples 1-32.

Example 35 is a system to implement of any of Examples 1-32.

Example 36 is a method to implement of any of Examples 1-32.

Although an embodiment has been described with reference to specific example embodiments, it will be evident that various modifications and changes may be made to these embodiments without departing from the broader scope of the present disclosure. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

The subject matter may be referred to herein, individually and/or collectively, by the term "embodiment" merely for convenience and without intending to voluntarily limit the scope of this application to any single inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, UE, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An edge device comprising a Deep Neural Network (DNN), the DNN comprising:
a plurality of input nodes;
a plurality of output nodes; and
weights provided between the input nodes and the output nodes, the weights provided by a memory array, the memory array comprising a plurality of non-volatile memory cells, each non-volatile memory cell having a non-volatile memory coupled to a switch, each non-volatile memory cell coupled to:
a wordline coupled to the switch for selection of the non-volatile memory cell,
an input line to provide a current to the non-volatile memory cell through a resistor, and
an output line to which the non-volatile memory cell provides a current component of an output dependent on whether the non-volatile memory cell is in an on state, in which a resistance of the non-volatile memory is substantially less than the resistance of the resistor to which the non-volatile memory cell is connected, or an off state, in which the resistance of the non-volatile memory is substantially greater than the resistance of the resistor to which the non-volatile memory cell is connected.

2. The edge device of claim 1, wherein:
the memory array further comprises a plurality of bitlines coupled with the non-volatile memory cells,
in a programming mode, each bitline is coupled to at least one of the non-volatile memory cells through a bitline select switch, and
in a read mode, each input line is coupled to at least one of the resistors through a read enable switch, each resistor coupled to a different one of the non-volatile memory cells.

3. A memory array comprising:
a plurality of non-volatile Random Access Memory (RAM) cells each comprising a first switch and a non-volatile memory coupled with the first switch, the first switch configured to be activated in each of a programming and read mode to respectively program and read the non-volatile memory; and
a plurality of Resistance-In-Memory RAM (RIMRAM) cells each comprising a second switch, a third switch, a unique one of the non-volatile memories, and a resistor coupled between the second switch and the unique one of the non-volatile memories, the second switch configured to be activated in the read mode to read the unique one of the non-volatile memories, the third switch configured to be activated in the programming mode to program the unique one of the non-volatile memories.

4. The memory array of claim 3, wherein the resistors are formed from high sheet resistance material having a resistance of at least about 10 ohms/square.

5. The memory array of claim 4, further comprising analog-to-digital converters (ADCs) coupled to the non-volatile memories, resistors of the ADCs formed from the high sheet resistance material to minimize variations caused by temperature and fabrication processes.

6. The memory array of claim 4, wherein in the programming mode, each non-volatile memory is programmable between:
an on state in which a resistance of the non-volatile memory is substantially less than the resistance of the resistor to which the non-volatile memory cell is connected, and
an off state in which the resistance of the non-volatile memory is substantially greater than the resistance of the resistor to which the non-volatile memory cell is connected.

7. A memory array comprising:
a plurality of wordlines;
a plurality of input lines; and
an n-bit Resistance-In-Memory Random Access Memory (RIMRAM) cell, wherein n is an integer having a value of at least 2, coupled to associated wordlines of the plurality of wordlines and an input line of the plurality of input lines, the n-bit RIMRAM cell comprising a plurality of 1-bit RIMRAM cells, each 1-bit RIMRAM cell comprising:

a resistor that is coupled to the input line, and
a non-volatile memory cell comprising:
  a switch, to which a respective wordline of the associated wordlines is coupled, and
  a non-volatile memory coupled between the resistor and the switch.

8. The memory array of claim 7, wherein the non-volatile memory comprises a Resistive RAM (RRAM).

9. The memory array of claim 7, wherein the resistor is formed from high sheet resistance material having a resistance of at least about 10 ohms/square.

10. The memory array of claim 7, wherein in a programming mode, each non-volatile memory is programmable between:
  an on state in which a resistance of the non-volatile memory is substantially less than the resistance of the resistor to which the non-volatile memory cell is coupled, and
  an off state in which the resistance of the non-volatile memory is substantially greater than the resistance of the resistor to which the non-volatile memory cell is coupled.

11. The memory array of claim 10, further comprising a plurality of bitlines, the n-bit RIMRAM cell coupled to a bitline of the plurality of bitlines such that each non-volatile memory cell is coupled to the bitline through a different bitline select switch.

12. The memory array of claim 7, wherein in a read mode, the input line is coupled to the resistors through a different read enable switch.

13. The memory array of claim 7, wherein in a read mode, the input line is coupled to the resistors through a different read enable diode.

14. The memory array of claim 7, wherein:
  the input line is coupled to a digital-to-analog converter,
  each non-volatile memory cell is coupled to an analog-to-digital converter, and
  a resistor in the analog-to-digital converter is formed from identical material as the resistors in the n-bit RIMRAM cell.

15. The memory array of claim 7, wherein:
  the input line is coupled to different non-volatile memory cells of the n-bit RIMRAM cell through different resistors,
  each of the different resistors has a different resistance, and
  each of the different non-volatile memory cells of the n-bit RIMRAM cell is coupled to a same source line.

16. The memory array of claim 15, wherein each of the different resistors has a resistance value that represents an integer multiple of a least resistance value among the resistors coupled to the input line.

17. The memory array of claim 15, wherein each of the different resistors has a resistance value that represents $2^m$ of a least resistance value among the resistors coupled to the input line, where m is a non-negative integer.

18. The memory array of claim 7, wherein the resistors of the n-bit RIMRAM cell and resistors of analog-to-digital converters to which the resistors of n-bit RIMRAM cell are coupled comprise a same material to minimize variations caused by temperature and fabrication processes.

* * * * *